United States Patent
Richt et al.

(10) Patent No.: US 11,901,948 B2
(45) Date of Patent: Feb. 13, 2024

(54) MODULATION DEVICE, CONTROL DEVICE, OPTICAL SYSTEM, LITHOGRAPHY SYSTEM AND METHOD

(71) Applicant: Carl Zeiss SMT GmbH, Oberkochen (DE)

(72) Inventors: Cornelius Richt, Aalen (DE); Mohammad Awad, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 201 days.

(21) Appl. No.: 17/583,396

(22) Filed: Jan. 25, 2022

(65) Prior Publication Data

US 2022/0149950 A1 May 12, 2022

Related U.S. Application Data

(63) Continuation of application No. PCT/EP2020/069899, filed on Jul. 14, 2020.

(30) Foreign Application Priority Data

Jul. 31, 2019 (DE) .......................... 102019211477.6

(51) Int. Cl.
*H04B 10/524* (2013.01)
*G02B 27/28* (2006.01)
*H03K 7/08* (2006.01)

(52) U.S. Cl.
CPC ......... *H04B 10/524* (2013.01); *G02B 27/283* (2013.01); *H03K 7/08* (2013.01)

(58) Field of Classification Search
CPC ....... H04B 10/524; G02B 27/283; H03K 7/08
See application file for complete search history.

(56) References Cited

U.S. PATENT DOCUMENTS

| | | | | |
|---|---|---|---|---|
| 6,169,618 B1* | 1/2001 | Higashino | ............ | H04B 10/504 398/9 |
| 6,172,781 B1* | 1/2001 | Doerr | ................... | H04B 10/505 398/9 |
| 6,424,076 B1 | 7/2002 | Gullapalli | | |

(Continued)

FOREIGN PATENT DOCUMENTS

| | | |
|---|---|---|
| DE | 102016225899 A1 | 6/2018 |
| WO | WO 2016033538 A1 | 3/2016 |

OTHER PUBLICATIONS

Translation of International Search Report for corresponding PCT Appl. PCT/EP2020/069899, dated Oct. 30, 2020.

*Primary Examiner* — Mina M Shalaby
(74) *Attorney, Agent, or Firm* — Fish & Richardson P.C.

(57) ABSTRACT

A modulation device includes: a signal splitter configured to generate: i) an M-bit wide partial signal comprising M more significant bits of an N-bit wide input signal; and ii) an L-bit wide partial signal comprising L less significant bits of the N-bit wide input signal, where L=N−M; a first modulation unit configured to generate a 1-bit wide pulse density modulation signal on the basis of the L-bit wide partial signal; a summation unit configured to generate an M-bit wide summation signal on the basis of the M-bit wide partial signal and the 1-bit wide pulse density modulation signal; and a second modulation unit configured to generate a 1-bit wide pulse width modulation signal on the basis of the M-bit wide summation signal.

21 Claims, 8 Drawing Sheets

(56) References Cited

U.S. PATENT DOCUMENTS

| | | | | |
|---|---|---|---|---|
| 6,735,398 | B1* | 5/2004 | Izadpanah | H04B 10/505 |
| | | | | 398/189 |
| 7,181,146 | B1* | 2/2007 | Yorks | H04B 10/0799 |
| | | | | 398/25 |
| 7,746,935 | B2* | 6/2010 | Bonfiglio | H03F 3/217 |
| | | | | 375/242 |
| 8,229,303 | B1* | 7/2012 | Lindsay | H04B 10/524 |
| | | | | 398/159 |
| 2002/0131470 | A1* | 9/2002 | Eggleton | H04B 10/572 |
| | | | | 372/102 |
| 2003/0018453 | A1* | 1/2003 | Carrick | H04B 10/564 |
| | | | | 702/189 |
| 2005/0180499 | A1* | 8/2005 | Hsu | H03K 7/08 |
| | | | | 375/238 |
| 2008/0193143 | A1* | 8/2008 | Mahgerefteh | H04B 10/504 |
| | | | | 398/183 |
| 2013/0142506 | A1* | 6/2013 | Nuttgens | H04B 10/50572 |
| | | | | 398/16 |
| 2014/0186056 | A1* | 7/2014 | Nuttgens | H04B 10/564 |
| | | | | 398/195 |
| 2016/0073465 | A1* | 3/2016 | Tao | H04B 10/27 |
| | | | | 315/226 |
| 2016/0309274 | A1* | 10/2016 | Ma | H03F 3/185 |
| 2018/0159650 | A1* | 6/2018 | Yu | H04B 10/675 |
| 2019/0302623 | A1 | 10/2019 | Knopf et al. | |
| 2021/0242944 | A1* | 8/2021 | Chaffee | H04B 10/5161 |
| 2023/0308097 | A1* | 9/2023 | D'Angelo | H03K 7/08 |
| | | | | 327/16 |

* cited by examiner

MODULATION DEVICE, CONTROL DEVICE, OPTICAL SYSTEM, LITHOGRAPHY SYSTEM AND METHOD

CROSS-REFERENCE TO RELATED APPLICATIONS

The present application is a continuation of, and claims benefit under 35 USC 120 to, international application PCT/EP2020/069899, filed Jul. 14, 2020, which claims benefit under 35 USC 119 of German Application No. 10 2019 211 477.6, filed Jul. 31, 2019. The entire disclosure of these applications are incorporated by reference herein.

FIELD

The present disclosure relates to a modulation device, a drive device including such a modulation device, an optical system, a lithography apparatus including such an optical system, a method for generating a modulation signal, and a method for driving an optical system.

BACKGROUND

Microlithography apparatuses are known which have actuatable optical elements, such as, for example, microlens element arrays or micromirror arrays. Microlithography is used for producing microstructured components, such as for example integrated circuits. The microlithography process is typically performed using a lithography apparatus, which has an illumination system and a projection system. Usually, the image of a mask (reticle) illuminated via the illumination system is in this case projected via the projection system onto a substrate, for example a silicon wafer, which is coated with a light-sensitive layer (photoresist) and arranged in the image plane of the projection system, in order to transfer the mask structure to the light-sensitive coating of the substrate. The imaging of the mask on the substrate can be improved using actuatable optical elements. By way of example, wavefront aberrations during exposure, which result in magnified and/or blurred imaging, can be compensated for.

Such correction using the optical element can involve detecting the wavefront and signal processing in order to determine a respective position of an optical element which enables the wavefront to be corrected as desired. In the last step, it is generally desirable to amplify the drive signal for a respective optical element and to output it to the actuator of the optical element. By way of example, the drive signal is present as a digitally encoded deflection of the actuator, wherein the deflection is proportional to the drive voltage, for example. Digital signals can be amplified using switching amplifiers, for example, which are controlled internally using a modulation of the drive signal. U.S. Pat. No. 7,746,935 B2 describes a device configured for driving a capacitive load using/on the basis of a digital input signal using a switching amplifier.

Known modulation types include pulse width modulation and pulse density modulation, which each generate a 1-bit wide output signal from an input signal. A potential undesirable property of pulse width modulation can be that, in the case of the fixed internal clock, it is possible that an improved resolution is only obtained to the detriment of a period of the modulation signal. Then, relatively sluggish filters are involved to obtain an output signal that is constant over a period. By contrast, the switching processes are maximized in pulse density modulation, leading to higher power losses in the amplifier and to the emission of radiated electromagnetic noise if the frequency is very high. Moreover, the switching times are not defined.

SUMMARY

The present disclosure seeks to provide an improved modulation device and a corresponding method.

According to a first aspect, a modulation device is proposed for generating a 1-bit wide modulation signal on the basis of an N-bit wide input signal. The modulation device includes a signal splitter for generating an M-bit wide first partial signal including M more significant bits of the input signal and for generating an L-bit wide second partial signal including L less significant bits of the input signal, where L=N−M, a first modulation unit for generating a 1-bit wide pulse density modulation signal on the basis of the second partial signal, a summation unit for generating an M-bit wide summation signal on the basis of the first partial signal and the pulse density modulation signal, and a second modulation unit for generating the 1-bit wide modulation signal on the basis of the summation signal.

This modulation device can have a number of desirable properties. Firstly, the division of the input signal into more significant and less significant bits can allow the generation of a pulse width modulation with the same resolution in a shorter period or, in the case of the same period, with an improved resolution. Secondly, as a result of processing the less significant bits in a pulse density modulation, it is possible that the information of the less significant bits of the input signal is only lost in the case where the more significant bits include a duty cycle of 100%, corresponding to a relative information loss of $(L/2^M)/2^M$. The information contained in the less significant bits is modulated onto a duty cycle of the pulse width modulation. One could say that the modulation device can generate a hybrid pulse width modulation, in which a coarse setting of the signal is obtained by a pulse width modulation, with a fine setting being obtained by changing the duty cycle of the pulse width modulation in successive periods. The hybrid pulse width modulation can have numerous desirable features, which emerge from embodiments.

The modulation device can be implemented in terms of hardware and/or in terms of software. In the case of an implementation in terms of hardware, the modulation device can be embodied as a computer or as a microprocessor, for example. In the case of an implementation in terms of software, the modulation device can be embodied as a computer program product, as a function, as a routine, as part of a program code or as an executable object. For example, the individual units of the modulation device, for example the signal splitter, the first modulation unit, the summation unit and/or the second modulation unit can each be implemented in terms of hardware and/or in terms of software.

The N-bit wide input signal can be a digital input signal, which can be fed to the modulation device both as a serial data signal, for example as a bitstream, and as a parallel data signal. The input signal can be a pulse code modulation signal (PCM). The input signal corresponds for example to a sampled analog signal, with a resolution of the input signal, both from a temporal and a dynamic point of view, being chosen on the basis of the respective application. Pursuant to the Nyquist theorem, in general, a sampling frequency should be chosen to be at least twice as high as a highest frequency in the signal to be sampled in order to be able to reconstruct the original signal from the input signal. The N-bit wide input signal can encode $2^N$ states, for example 256 states can be distinguished using an 8-bit signal. This could also be referred to as a word width of the signal. Optionally, the modulation device generates the modulation signal with a frequency so high that the input signal is constant, or substantially constant, during a period of the modulation signal. By way of example, the modulation signal can be generated with a frequency of 1 MHz, with the input signal changing with no more than 100 kHz, such as no more than 10 kHz.

The signal splitter can divide the input signal into M more significant bits and L less significant bits. In the case of an 8-bit signal or word, the bits to the left can be the more significant bits and the bits to the right are the less significant bits. By way of example, if M=5 and L=3 are chosen, the first five bits, 10011, of an input signal 10011101 can be the more significant bits and the last three bits, 101, can be the less significant bits. M or L can be chosen as desired, for as long as N=M+L is observed. The signal splitter can provide a first partial signal including the M more significant bits and a second partial signal including the L less significant bits.

The second partial signal can be fed to the first modulation unit. The first modulation unit can be configured to generate a pulse density modulation signal on the basis of the second partial signal. The pulse density modulation signal can have a width of one bit; that is to say it can be either "high" or "low", or else "1" or "0", at any one time. By way of example, the second modulation unit can be implemented as a sigma-delta modulator.

In pulse density modulation, a switching frequency, that is to say switching from "high" to "low" and vice versa, can be maximized. By way of example, in the case of an input signal with a level of 50% of the maximum level, the pulse density modulation signal, the signal, is switched in each clock pulse of the first modulation unit. In the case of a level of 75%, the signal is "high" in the first three clock pulses and "low" in the fourth clock pulse, for example.

In embodiments, the first modulation unit can have a table, for example a lookup table (LUT), in which a waveform to be output for the pulse density modulation signal is stored for a respective value of the second partial signal. By way of example, the table can be different for different values of L, that is to say second partial signals of different width, for example 4 bits or 5 bits. For example, the stored pulse density modulation signal can also deviate from a pulse density modulation signal generated by a sigma-delta modulator. Optionally, a maximum switching frequency of the pulse density modulation signal can be set using such a table.

The pulse density modulation signal can be added to the first partial signal including the M more significant bits in the summation unit. If the pulse density modulation signal is a "0", then the first partial signal remains unchanged; if it is a "1", then the value of the first partial signal increases by 1, for example 1001+1=1010. It should be observed that if the first partial signal is 1111, for example, the latter remains unchanged by the addition of a "1" since 1111 already represents the largest number of a 4-bit signal. The summation unit outputs the summed signal, which is an M-bit wide signal, as a summation signal to the second modulation unit.

On the basis of the summation signal, the second modulation unit can generate a modulation signal which corresponds to a pulse width modulation. Compared to the N-bit wide input signal, the pulse width modulation is generated by an M-bit wide signal, which is shorter by L bits. Therefore, the period of the pulse width modulation can shorten accordingly, with an unchanging internal clock.

By way of example, the input signal is 10-bit wide. If the pulse width modulation has an internal clock of 1 μs, corresponding to a frequency of 1 MHz, and a resolution of 10 bits, corresponding to 1024 levels, then the pulse width modulation has a period of 1.024 ms. In the case of an input level of 50%, the modulation signal then is "high" for 0.512 ms and "low" for the remaining 0.512 ms of the period. If M=8 is set in this example, then the resolution of the pulse width modulation can be reduced to 8 bits, corresponding to 256 levels. Accordingly, the period reduces to 0.256 ms.

Hence, the modulation device can be suitable for reducing the period of the pulse width modulation without a loss of resolution. Alternatively, the modulation device can be simplified such that the period remains unchanged but an internal structure of the modulation device is simpler. By way of example, an internal clock frequency of the modulation device can be reduced. By modulating the L less significant bits on the change in the duty cycle of successive periods of the pulse width modulation, a quantization noise can be shifted to higher frequencies (noise shaping).

According to an embodiment of the modulation device, the latter includes a clock generator for generating an internal clock frequency $f_1$, wherein the second modulation unit is configured to generate the modulation signal with a shortened period $P^*=2^M \cdot t_1$, where $t_1=1/f_1$.

The clock generator can be configured to generate the internal clock frequency $f_1$, wherein the clock generator can also generate the internal clock frequency $f_1$ on the basis of an externally specified clock, for example. The internal clock $f_1$ can be determined on the basis of a maximum frequency of the input signal taking into account the Nyquist theorem. In this way, the input signal can be reconstructed without loss of information from the modulation signal.

In the case of a constant internal clock frequency $f_1$, the shortened period $P^*$ of the modulation signal is only a fraction of a period $P=2^N \cdot t_1$ arising if a pulse width modulation is generated directly from the input signal. In this case, $P^*=P/2^N \cdot M$ applies.

A minimum period of the pulse density modulation signal can be exactly $P^*$. That is to say, an interval between two switching times of the pulse density modulation signal can include a shortened period $P^*$. This can ensure that a modulation of the duty cycle of the modulation signal is obtained by the pulse density modulation signal.

By way of example, the second modulation unit generates the pulse width modulation as follows: The second modulation unit has a counter which operates with the internal clock pulse $f_1$, for example $f_1=10$ MHz. A period of the counter, that is to say the duration of a clock pulse, therefore is $t_1=1/f_1=0.1$ μs. With this clock pulse, the counter counts to a specified number, which defines the resolution of the modulation signal, for example from 0 to 1023, corresponding to 1024 levels or a resolution of 10 bits. A counting period, that is to say the time taken for the counter to count to 1023 once, emerges as $P=2^M \cdot t_1=102.4$ μs. A frequency of the modulation signal with this period therefore is $f_2=1/P=9.77$ kHz. The counter outputs a counter signal, which corresponds to the current counter value. By way of example, the summation signal is applied to a first input of a comparison unit of the second modulation unit, the counter signal is applied to a second input. An output of the comparison unit is set to "high", or to "1", for as long as the counter signal is less than the addition signal. By way of example, if the summation signal is 0101011000 (corresponding to 344 in decimal, that is to say a duty cycle of 344/1024=0.336), then the output of the comparison unit is "high" for 34.4 μs and "low" for the remaining period of (102.4−34.4)μs=68 μs.

The summation unit can provide the summation signal with the internal clock frequency f1.

According to an embodiment of the modulation device, the signal splitter is configured to generate the first partial signal and the second partial signal on the basis of a predetermined ratio K=L/M, where, for example, K≤1 (e.g., K≤0.5, K≤⅓).

The ratio K is the ratio of the number of more significant bits to the number of less significant bits, into which the input signal is divided. In the case of K=1, the number of more significant and less significant bits is equal, that is to say N=16, M=8, L=8, for example. M=2·L can be desirable, that is to say for example N=12, M=8, L=4, or else M=3·L, for example N=32, M=24, L=8.

According to an embodiment of the modulation device, the input signal has a width N of 4-64 bit (e.g., 6-32 bit, 8-16 bit).

The higher the resolution of the input signal, in general, the more accurately differences in a certain variable can be represented. However, signal processing of very high-resolution signals can be more complicated than in the case of less resolved signals. In the case of the modulation device it can be, for example, a compromise between high resolution and a short period of the pulse width modulation, as presented above.

According to a second aspect, a drive device for driving an actuator on the basis of an input signal is proposed. The drive device includes a modulation device according to the first aspect, for generating a modulation signal on the basis of the input signal, an amplifier unit for generating an amplified signal on the basis of the modulation signal, and a filter unit for filtering the amplified signal and for outputting the filtered signal for driving the actuator.

This drive device can be desirable in that, on account of generating the modulation signal using the modulation device according to the first aspect, the filter unit can have a simplified design in comparison with a conventional device which modulates the input signal into a pulse width modulation. A desirable property over a device using pure pulse density modulation can be that the switch-on time is known and a switching frequency can be constant. Hence, power loss in the amplifier can be reduced and an emission of electromagnetic radiation on account of very high switching frequencies, which may occur in the case of pulse density modulation, can be avoided or suppressed by targeted measures. As a result of using hybrid pulse width modulation, it is possible to combine the desirable properties of pulse width modulation and pulse density modulation, and at least partly avoid their respective potentially undesirable properties.

According to an embodiment of the drive device, the drive device includes a first unit for generating the N-bit wide input signal on the basis of a drive signal, wherein the first unit can be configured to generate the input signal on the basis of a high-voltage feedback of a voltage supply of the amplifier unit and/or a drive voltage feedback of the filtered signal.

By way of example, the first unit is designed as an analog-to-digital converter (A/D converter) and is configured to sample an analog drive signal and generate the input signal therefrom. By way of example, the analog drive signal can be a closed-loop control signal, for example of an adjustment mechanism. However, the drive signal can also already be a digital signal which is converted into the N-bit wide input signal by the first unit.

In embodiments of the drive device, the first unit for ascertaining the input signal can be configured on the basis of the drive signal. By way of example, the first unit is designed as an FPGA, a microcontroller, and/or a signal processor. By way of example, the first unit is configured to apply a mathematical operation for the purposes of generating the input signal. For example, the mathematical operation corresponds to a conversion, a transformation and/or a function, the result of which is the input signal.

By way of the high-voltage feedback of the voltage supply, the first unit can be configured to consider for example fluctuations in the voltage supply when generating the input signal. In the present case, high voltage is understood to mean any voltage higher than the voltage used to operate the modulation device, the latter being for example 0-5 V. Hence, high voltage is for example any voltage above 10 V, such as 24 V, 48 V, 100 V, 240 V.

By way of the drive voltage feedback, the first unit can be configured to generate the input signal on the basis of properties of the filter unit such as, for example, the inertia thereof, and/or on the basis of properties of the driven actuator. For example, in the case of very fast changes in the drive signal, the first unit can generate the input signal using an overdrive such that the filtered signal reaches the target level quicker.

According to an embodiment of the drive device, a clock frequency of the first unit is greater than or equal to the internal clock frequency f1 of the modulation signal.

According to an embodiment of the drive device, the amplifier unit includes a switching amplifier, such as a half H-bridge.

A switching amplifier can also be referred to as a class-C or class-D amplifier. Such amplifiers have discrete voltage levels which can be output. By way of example, such amplifiers have exactly two levels, for example 0 V and 48 V, or else −24 V and +24 V.

The respective voltage levels that can be output by the switching amplifier depend for example on the voltage sources used to operate the switching amplifier. The voltage levels can therefore be chosen freely, depending on the specific application, by virtue of the voltage sources being chosen accordingly. Optionally, one of the voltage levels is the ground potential. Voltage values lying between the voltage levels are output as a rectangular signal with a corresponding root-mean-square value, that is to say by rapid switching, for example using the hybrid pulse width modulation. Subsequent filtering results in a DC voltage signal with the root-mean-square value, wherein relatively small fluctuations may still be present in the filtered signal, depending on the filter Q-factor.

A half H-bridge corresponds to one half of an H-bridge circuit. By way of example, the latter includes two switching transistors, of which one is configured for switching a first voltage level and the second is configured for switching a second voltage level, wherein the switching transistors are switched alternately, such that only one in each case is switched on. The switching transistors are switched for example depending on the pulse width modulation signal of the modulation device.

It should be noted that the amplifier unit can also have a full bridge circuit or H-bridge.

According to an embodiment of the drive device, the filter unit includes at least an inductor, a resistor and/or a capacitance.

The filter unit can form a low-pass filter that smooths the amplified signal over time. The filtered signal can correspond to a time average value of the amplified signal. The filter unit can for example be designed as a multi-stage filter and have both inductors and capacitances. The filter unit can be configured to filter the amplified signal such that a remaining AC component in the filtered signal is less than 0.1% of the amplitude. The filter unit can also be referred to as a demodulator.

The filter unit can be designed at least as a second-order filter. For example, the filter unit can be designed as a higher-order, for example fourth-order, filter. Higher filter orders can be realized for example by a cascade of lower-order filters. In this case, the filter unit can be designed for example as a passive filter. The filter unit can have for example a cutoff frequency from a range of 1 kHz-10 kHz. A slope of the filter unit and also a type of the filter unit, for example whether the filter unit is embodied as a Butterworth filter, a Chebyshev filter, a Bessel filter, a Sallen-Key filter or some other type of filter, can be selected specifically for a respective application.

The filter unit filters the amplified signal, for example in such a way that the lowest frequency $f_{min}$ contained in a noise signal is no less than for instance the frequency of the modulation signal divided by $2^L$, $f_{min} \geq 1/(P^* \cdot 2^L) = f1/2^{M+L}$.

According to a third aspect, an optical system including a number of actuatable optical elements is proposed. Each of the actuatable optical elements of the number is assigned an actuator and each actuator is assigned a drive device for driving the actuator according to the second aspect.

This optical system can be desirable in that the actuatable optical elements are driven by the hybrid pulse width modulation.

The optical system can include, for example, a micromirror array and/or a microlens element array having a multiplicity of optical elements that are actuatable independently of one another.

According to an embodiment of the optical system, the optical system includes a plurality of actuatable optical elements, wherein respective switching times of amplifier units of at least two drive devices, for example of each pair of drive devices, differ.

This embodiment can be desirable if the optical system has many actuatable optical elements. By way of example, the optical system can include a micromirror array with 64×64=1024 micromirrors, which are actuatable individually. Each actuator can be assigned a drive device according to the second aspect. Each of the drive devices can use this to generate a filtered signal for driving the respective actuator on the basis of the respective input signal. Since the modulation device can generates a pulse width modulation signal for controlling the amplifier unit, one of two switching times of the pulse width modulation signal can be known, for example when the pulse width modulation signal is set to "high" at the beginning of each period thereof. Therefore, the drive devices of the actuators can be synchronized such that no two drive devices have the same period start. By way of example, a period in the aforementioned example can be subdivided into 1024 intervals, and then the period start of a respective drive device can be placed into one of the intervals. This can unburden, for example, the voltage source providing the upper level since such that it is possible for a voltage source to withstand one switch-on process at any one time. Furthermore, a power loss due to switching can be distributed over an entire period in time, as a result of which cooling of the drive device can be simplified.

In embodiments, groups of drive devices can be defined, wherein all drive devices of a group have the same switching time, but different groups each have different switching times.

According to an embodiment of the optical system, a respective one of the actuators includes a capacitive and/or an inductive load.

Depending on the specific embodiment of the filter unit of the drive devices, a power loss produced in a respective actuator can be reduced, which can afford desirable properties in the cooling of the optical system. This can be achieved, for example, if the filter unit has a capacitor connected in parallel with the actuator.

According to a fourth aspect, a lithography apparatus including an optical system according to the third aspect is proposed.

A lithography apparatus can include an illumination system and an imaging system. The illumination system can include, for example, a light source and a beam-shaping optical unit. The imaging system can include, for example, an imaging optical unit for imaging the mask onto the substrate.

The optical system can be used in the illumination system, in the beam-shaping optical unit, and also in the imaging system. In some embodiments, the optical system is embodied as a microlens element array or a micromirror array and serves for example for wavefront correction in the imaging system.

The lithography apparatus is for example an EUV lithography apparatus, the working light of which is in a wavelength range of 0.1 nm to 30 nm, or a DUV lithography apparatus, the working light of which is in a wavelength range of 30 nm to 250 nm.

Optionally, the lithography apparatus additionally includes a measuring system configured for detecting a wavefront and configured for outputting a correction signal for correcting the wavefront using the optical system. The correction signal can serve for example as the input signal for the drive device.

According to a fifth aspect, a method is proposed for generating a 1-bit wide modulation signal on the basis of an N-bit wide input signal. In a first step, an M-bit wide first partial signal including M more significant bits of the input signal is generated. In a second step, an L-bit wide second partial signal including L less significant bits of the input signal is generated, where L=N−M. In a third step, a 1-bit wide pulse density modulation signal is generated on the basis of the second partial signal. In a fourth step, an M-bit wide summation signal is generated on the basis of the first partial signal and the pulse density modulation signal. In a fifth step, the 1-bit wide modulation signal is generated on the basis of the summation signal.

The method can be suitable for operating the modulation device according to the first aspect, and it has the same desirable properties as described there.

The embodiments and features described for the modulation device are correspondingly applicable to the proposed method.

Furthermore, a computer program product is proposed, which can prompt a program-controlled apparatus to carry out the proposed method.

According to a sixth aspect, a method is proposed for driving an optical system, for example according to the third aspect, including a multiplicity of actuatable optical elements. Each of the actuatable optical elements of the multiplicity can be driven using an amplified and filtered modulation signal that is generated according to the fifth aspect.

The embodiments and features described for the optical system are correspondingly applicable to the proposed method.

In some embodiments, the modulation signal of different actuatable optical elements is generated such that period start times of two modulation signals differ in each case.

Furthermore, a method is proposed for operating a lithography apparatus according to the fourth aspect. The embodiments and features described for the lithography apparatus are correspondingly applicable to the proposed method.

"A(n); one" in the present case should not necessarily be understood as restrictive to exactly one element. Rather, a plurality of elements, such as, for example, two, three or more, can also be provided. Any other numeral used here, too, should not be understood to the effect that there is a restriction to exactly the stated number of elements. Rather, numerical deviations upwards and downwards are possible, unless indicated to the contrary.

Further possible implementations of the disclosure also include not explicitly mentioned combinations of features or embodiments that are described above or below with respect to the exemplary embodiments. In this case, a person skilled in the art will also add individual aspects as improvements or supplementations to the respective basic form of the disclosure.

Further configurations and aspects of the disclosure are the subject matter of the claims and also of the exemplary embodiments of the disclosure described below.

BRIEF DESCRIPTION OF THE DRAWINGS

In the text that follows, the disclosure is explained in more detail on the basis of exemplary embodiments with reference to the accompanying figures, in which.

DESCRIPTION OF EXEMPLARY EMBODIMENTS

Unless indicated to the contrary, elements that are the same or functionally the same have been provided with the same reference signs in the figures. It should also be noted that the illustrations in the figures are not necessarily true to scale.

Figure 1:
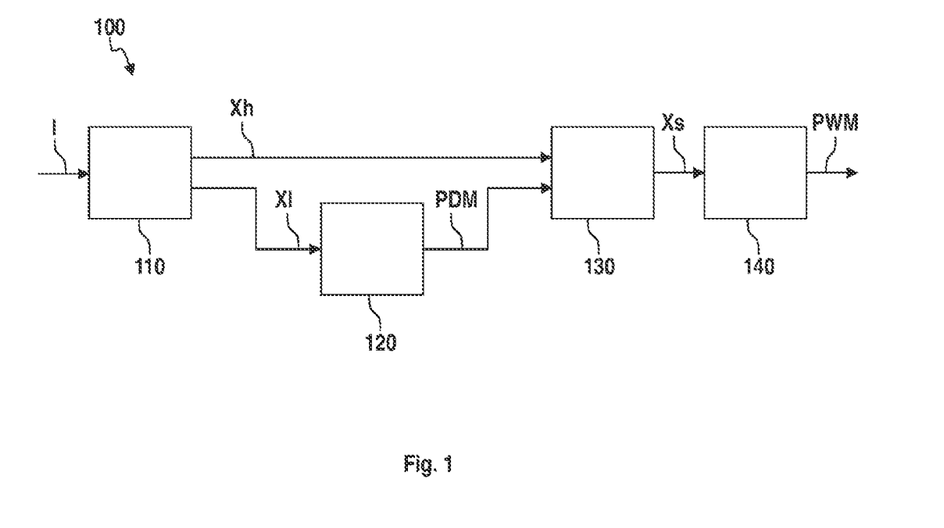
FIG. 1 shows a schematic block diagram of a first embodiment of a modulation device.

FIG. 1 shows a schematic block diagram of a first embodiment of a modulation device 100. The modulation device 100 includes a signal splitter 110, a first modulation unit 120, a summation unit 130 and a second modulation unit 140. From an N-bit wide input signal I, the modulation device 100 generates a 1-bit wide pulse width modulation signal PWM. In this case, a temporal mean of the pulse width modulation signal PWM corresponds for example to a value of the input signal I. Here, the modulation device 100 operates with an internal clock frequency f1, which is generated by an internal clock generator for example, is specified or supplied from externally, and/or is generated on the basis of a clock frequency specified externally. The internal clock frequency f1 can be chosen on the basis of a maximum frequency of the input signal I, for example at least twice as high, such as ten times as high. By way of example, a maximum frequency of the input signal I is 1 kHz-100 kHz (e.g., 1 kHz-20 kHz, 1 kHz-10 kHz, 5 kHz-10 kHz).

From the N-bit wide input signal I, the signal splitter 110 generates a first partial signal Xh, which includes M more significant bits of the input signal I, and a second partial signal Xs, which includes L=N−M less significant bits of the input signal I. In the case of a serial input signal I, the first M bits of a word, which are received in the first M cycles of a transfer cycle, form the first partial signal Xh while the remaining L bits of the word form the second partial signal X1, for example.

The first modulation unit 120 generates a pulse density modulation signal PDM from the second partial signal X1. The pulse density modulation signal PDM has a minimum period $P^* = 2^M \cdot t1$, where $t1 = 1/f1$ is the period of the internal clock frequency f1. The pulse density modulation signal PDM corresponds to a signal which maximizes the switching frequency on the basis of the values of N, M and L. This is described in detail below on the basis of FIG. 2.

The summation unit 130 adds the 1-bit wide pulse density modulation signal PDM to the M-bit wide first partial signal Xh, and outputs an M-bit wide summation signal Xs. The summation unit generates the summation signal Xs for example with the internal clock frequency f1.

On the basis of the summation signal Xs, the second modulation unit 140 generates a modulation signal PWM which corresponds to a pulse width modulation of the summation signal Xs. In this case, a period P* of the modulation signal PWM is shorter than a period P of a pulse width modulation signal PWM1 (see FIG. 2) that is generated on the basis of the N-bit wide input signal I in the case of the same internal clock frequency f1 since the summation signal Xs only has a width of M=N−L bits but uses the same internal clock frequency f1.

Figure 2:
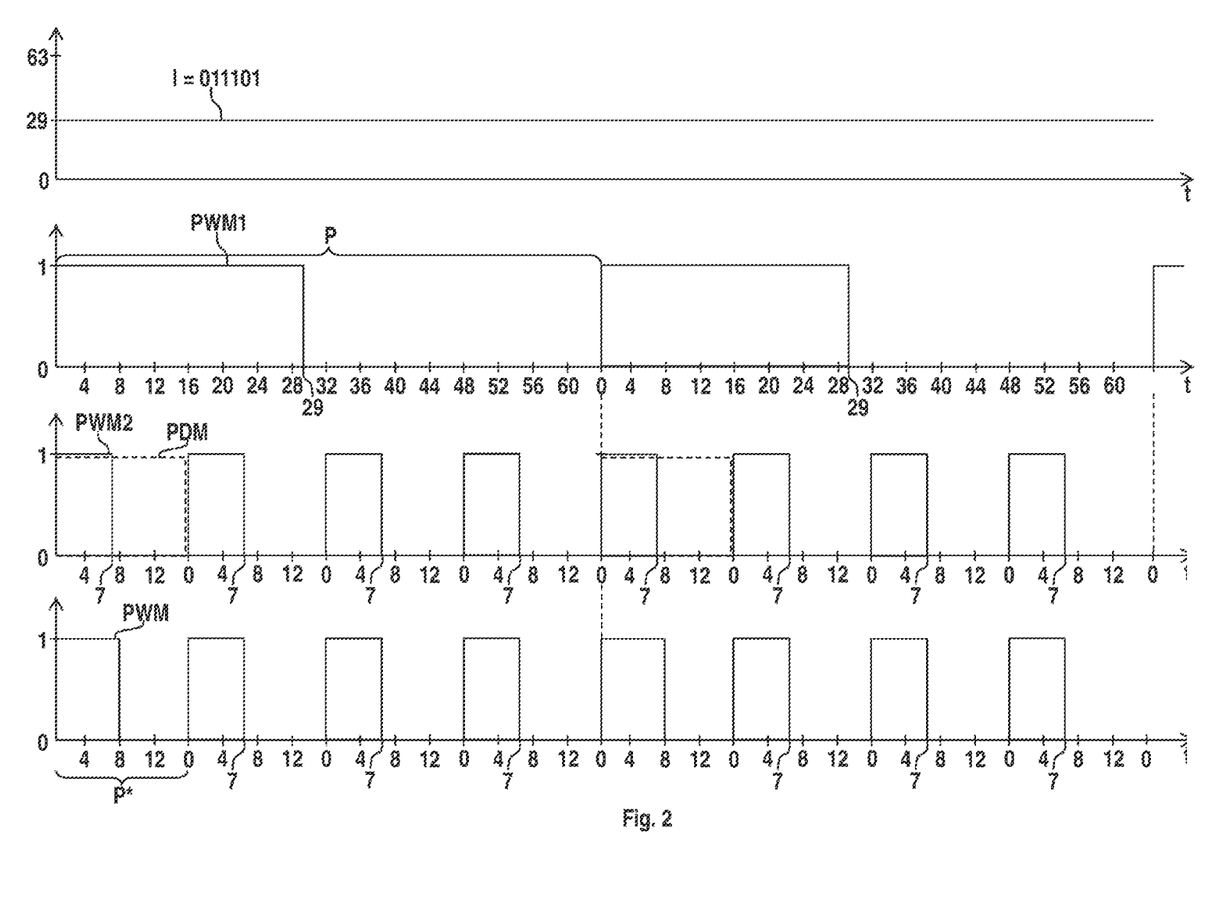
FIG. 2 shows four diagrams with different signals for explaining the functionality of the modulation device.

FIG. 2 shows four diagrams arranged on top of one another, with different signals for explaining the functionality of the modulation device 100 of FIG. 1. All four diagrams have a common horizontal time axis t (abscissa). The vertical axis (ordinate) in each case corresponds to a signal level, with the uppermost diagram having a value range between 0 and 63 (corresponding to the 64 levels of a 6-bit wide signal) and the lower three diagrams each having only "0" or "1" as a value (corresponding to a 1-bit signal). For elucidating the functional principle of the modulation device 100, N=6, M=4, L=2 have been chosen in this example.

The uppermost diagram shows a digital 6-bit wide input signal I with the value of 011101, corresponding to a value of 29 when written as a decimal and a duty cycle of a pulse width modulation of 45.3%. The input signal I is constant over the shown time period.

The second diagram from the top shows a pulse width modulation signal PWM1 in exemplary fashion, which would be generated in the case of a direct conversion of the 6-bit wide input signal I using a pulse width modulator with a resolution of exactly 6 bit. A period P of the exemplary pulse width modulation signal PWM1 is 64 clock pulse periods of the internal clock frequency f1. In accordance with the principle of pulse width modulation, the pulse width modulation signal PWM1 is "1" for the first 29 clock pulses and "0" for the remaining 35 clock pulses, as a result of which the duty cycle of 45.3% is obtained.

The third diagram from above shows firstly a pulse density modulation signal PDM (dashed line) and secondly a pulse width modulation signal PWM2. The pulse width modulation signal PWM2 corresponds to the result of a pulse width modulation when based on the first partial signal Xh including the 4 more significant bits (that is to say 0111 in this case) of the input signal I and the resolution of the pulse width modulator is set to 4 bit, corresponding to 16 levels, with the same internal clock frequency f1. Hence, a period P* of the pulse width modulation signal PWM2 still is 16 clock pulses and hence only a quarter of the period P. The first partial signal Xh=0111 corresponds to a value of 7, which is why the pulse width modulation signal PWM1 is "1" for the first seven clock pulses and "0" for the remaining nine clock pulses. Hence, the duty cycle of the pulse width modulation signal PWM2 emerges as 43.8%.

The pulse density modulation signal PDM is generated on the basis of the second partial signal X1 including the 2 less significant bits (that is to say 01 in this case) of the input signal I, and with a minimum period duration P*. According to the value X1=01, the pulse density modulation signal PDM is "1" in an interval, in the present case in the first interval, of a period P, and otherwise it is "0". In alternative embodiments, "1" can also be present in the second, third or fourth interval. The pulse density modulation signal PDM is repeated after a period P since the input signal I remains unchanged. Optionally, the modulation device 100 is designed such that the pulse density modulation signal PDM cannot change within a period P. For example, this can be achieved by virtue of a sample-and-hold member keeping the second partial signal X1 constant for a respective period P, and outputting this to the first modulation unit 120.

The lowermost diagram (the fourth diagram from the top) shows a modulation signal PWM, as generated by the modulation device 100 for example. The modulation signal PWM corresponds to a pulse width modulation signal generated on the basis of the summation signal Xs. For example, the summation signal Xs is generated during each internal clock cycle on the basis of the respective current values of the first partial signal Xh and the pulse density modulation signal PDM. In the present case, the summation signal Xs is 0111+1=1000 (corresponding to decimal 8; duty cycle 50%) in the first 16 internal clock cycles and 0111+0=0111 (corresponding to decimal 7; duty cycle 43.8%) in the next three intervals of 16 clock cycles. Therefore, the modulation signal PWM has a duty cycle of 50% in the first period P* including 16 clock cycles and a duty cycle of 43.8% in the three subsequent periods P*. Averaged over four periods P*, which correspond to a period P, this consequently yields a duty cycle of 45.3%, corresponding exactly to the 6-bit input signal I=011101.

It is evident from the diagrams that a filter unit 230 (see FIG. 4), which forms a DC signal with a constant amplitude from the pulse width modulation signal PWM1 and the modulation signal PWM for example, can have a significantly simpler structure in the case of the modulation signal PWM.

Figure 3:
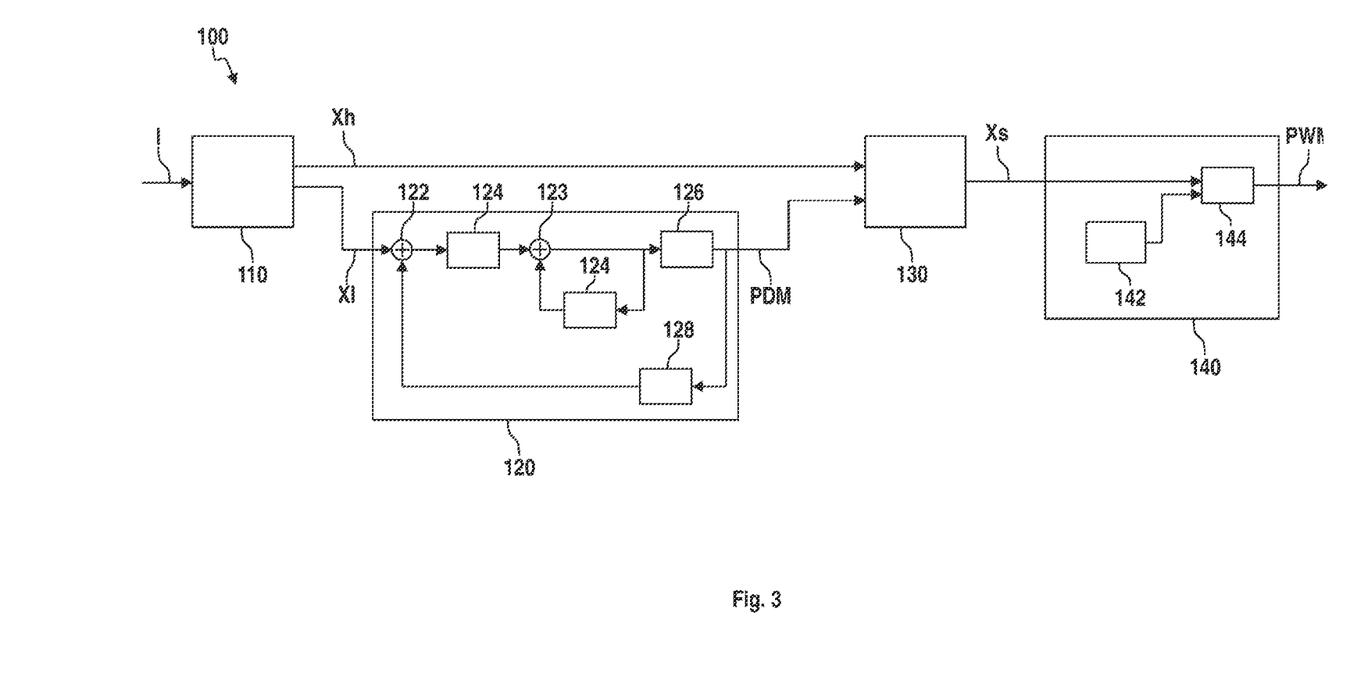
FIG. 3 shows a schematic block diagram of a second embodiment of a modulation device.

FIG. 3 shows a schematic block diagram of a second embodiment of a modulation device 100. The modulation device 100 has the same structure as the modulation device 100 described on the basis of FIG. 1. FIG. 3 additionally illustrates a possible implementation of the first modulation unit 120 as a delta-sigma modulator, and of the second modulation unit 140 with an integrated counter 142.

The first modulation unit 120 is designed as a delta-sigma modulator and includes six functional members with two feedback loops. The second partial signal X1 is fed to a first retardation member 124 via a first summation node 122. The retardation member 124 delays the supplied signal by one clock cycle. The delayed signal is fed to a comparator 126 via a second summation node 123. Furthermore, provision is made of a first feedback loop which feeds the signal fed to the comparator 126 to the second summation node 123 via a further retardation member 124.

The comparator 126 is configured to compare the supplied signal to a specified threshold. By way of example, the specified threshold can correspond to the value of the second partial signal X1. The comparator 126 generates a 1-bit wide output signal which is the pulse density modulation signal PDM. In this case, the output of the comparator 126 is "1" or "high" if the value of the signal fed to the comparator 126 is greater than or equal to the threshold, and otherwise it is "0" or "low". The output of the comparator 126 is returned inverted to the first summation node 122 using a second feedback loop.

A multiplication member 128 is arranged in the second feedback loop and multiplies the output signal by a predetermined factor. The multiplication member 128 has an output signal with a bit width corresponding to the factor +1. By way of example, if the factor is 2, the signal is exactly 3-bit wide downstream of the multiplication member 128. This is due to the input signal of the multiplication member 128 always being 1-bit wide. If the input signal of the multiplication member 128 is "1" or "high", then the output signal of the multiplication member 128 has a leading "1", that is to say it would be for example 100 in the case of 3-bit width. The output signal of the multiplication member 128 is fed with a negative sign to the first summation node 122, that is to say it is subtracted from the second partial signal X1 by the summation node 122.

It should be noted that the embodiment of the delta-sigma modulator 120 described here is only exemplary, and that the first modulation unit 120 can also be designed in any other way provided it has the described properties.

The pulse density modulation signal PDM generated by the delta-sigma modulator 120 is fed to the summation unit 130 as described above, the latter providing the summation signal Xs and feeding the latter to the second modulation unit 140. The second modulation unit 140 includes a counter 142, which counts with the internal clock frequency f1 to $2^N$. The counter signal is compared to the supplied summation signal Xs in a comparator 144. The comparator 144 outputs the modulation signal PWM accordingly as a 1-bit wide signal.

Figure 4:
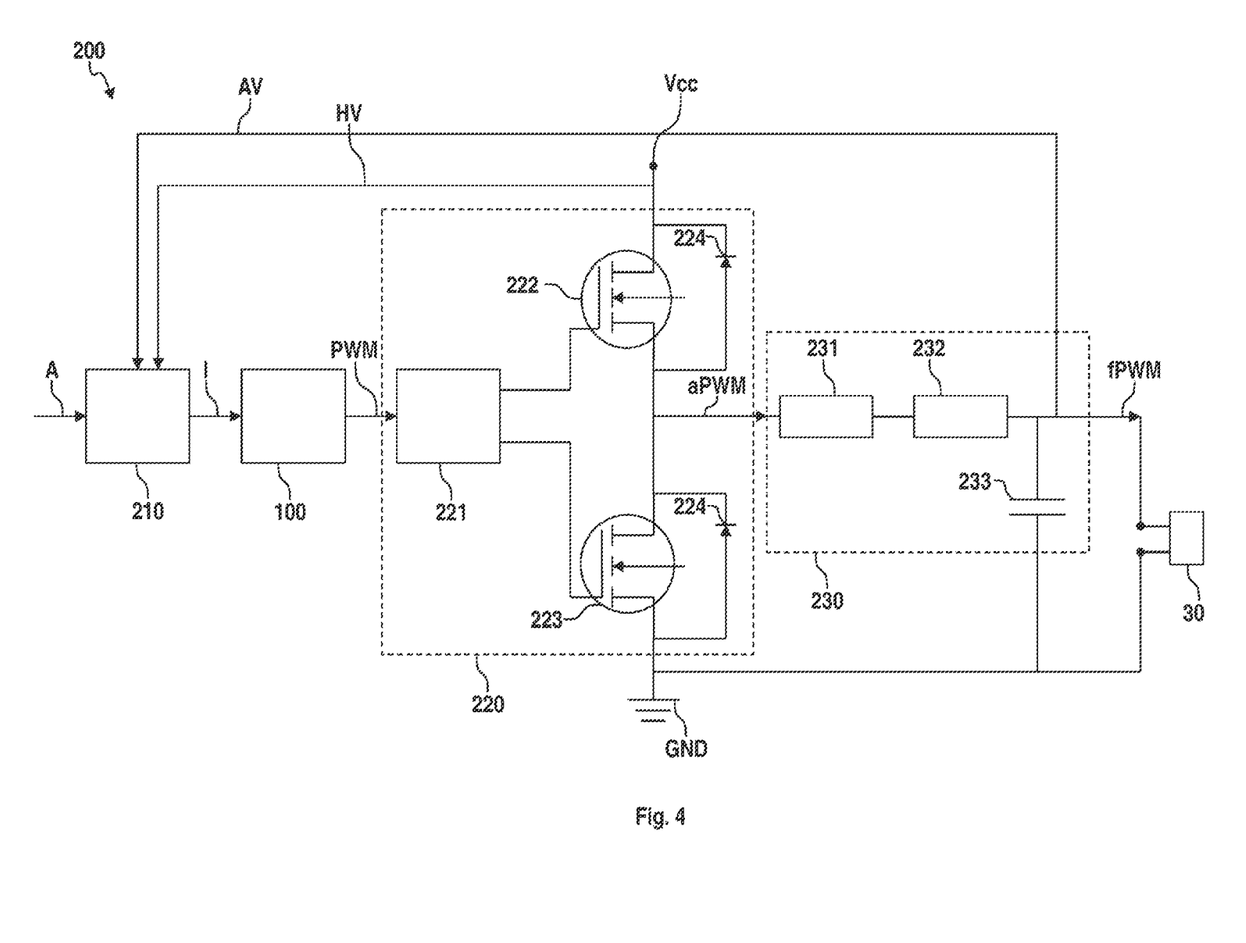
FIG. 4 shows a schematic block diagram of an embodiment of a drive device.

FIG. 4 shows a schematic block diagram of an embodiment of a drive device 200 for driving an actuator 300. The drive device 200 includes a first unit 210, a modulation device 100, for example as described in relation to FIG. 1 or FIG. 3, an amplifier unit 220 and a filter unit 230.

The first unit 210 is configured to generate the N-bit wide input signal I on the basis of the drive signal A. The drive signal A can be a digital signal, or else an analog signal. By way of example, the drive signal A is a control signal of a servomotor, which is continuous in time and in terms of value. In embodiments, the first unit 210 can moreover include inputs for high-voltage feedback HV or drive voltage feedback AV, and can consider a respective feedback level when generating the input signal I. It should be noted that the first unit 210 is optional, especially if the drive signal A already has a form that corresponds to the form desired for the input signal I.

The input signal I is processed by the modulation device 100 for generating a modulation signal PWM, for example as described above on the basis of FIGS. 1-3.

The modulation signal PWM is fed to the amplifier unit 220, which amplifies the latter and outputs the latter as amplified signal aPWM. By way of example, the amplifier unit 220 has a gate driver 221, configured to switch the two transistors 222, 223. The gate driver 221 switches the upper transistor 222 to conductive and the lower transistor 223 to blocking when the modulation signal PWM is "1" or "high". Then, the middle between the two transistors 222, 223, which forms the output of the amplifier unit 220, is at the potential of the voltage source Vcc. The potential Vcc is for example 12 V-480 V, such as 48 V-240 V, and is chosen on the basis of the actuator 300 to be driven. Conversely, the gate driver 221 switches the upper transistor 222 to blocking and the lower transistor 223 to conductive when the modulation signal PWM is "0" or "low". Then the middle between the two transistors 222, 223 is at ground potential GND. Furthermore, the amplifier unit 220 respectively has a diode 224.

It should be noted that any desired potential provided by a voltage source can be used instead of the ground potential GND. In the present case, the transistors 222, 223 are designed as n-channel MOSFETs.

Alternatively, the transistors 222, 223 can also be designed as p-channel MOSFETs, as a p-channel and an n-channel MOSFET, silicon MOSFETs, GaN FETs, IGBTs and/or bipolar transistors.

The filter unit 230 includes, for example, an inductor 231, for example a coil, connected in series with the actuator 300, and also a resistor 232, such as an ohmic resistor, and a capacitance 233, such as a capacitor, connected in parallel with the actuator 300. The specific choice of values for the inductor 231, the resistor 232 or the capacitor 233 depends on the actuator 300 to be driven and the desired properties of the filtered signal fPWM. At a given time, the filtered signal fPWM can have a level which is a percentage of the level of the input signal I at the time. For example, the level of the filtered signal fPWM is constant over the time of a period P* and a period P provided the level of the input signal I has not just changed.

It should be noted that a filter unit 230 need not necessarily have all the components shown, but rather also has for example only an inductor 231 and a resistor 232, but not a capacitor 233. Further arrangements of the individual components are likewise possible and can be chosen depending on the actuator 300 to be driven and the desired properties of the filtered signal fPWM.

By way of example, the frequency of the input signal I can be 12 kHz, the internal clock frequency f1 of the modulation device 100 is 200 MHz, the voltage source Vcc of the amplifier unit 220 is 100 V and the filter unit 230 includes an inductor 231 with 3.3 mH and a capacitor 233 with 2 μF.

The output of the filter unit 230 is connected to the actuator 300 to be driven, and so the filtered signal fPWM serves as an input signal for the latter. By way of example, the actuator 300 can be designed as a piezo actuator, the linear deflection of which is proportional to a voltage applied. Further possible actuators 300 are electrical actuators, magnetic actuators, electromagnetic actuators, thermal actuators and suchlike.

Figure 5:
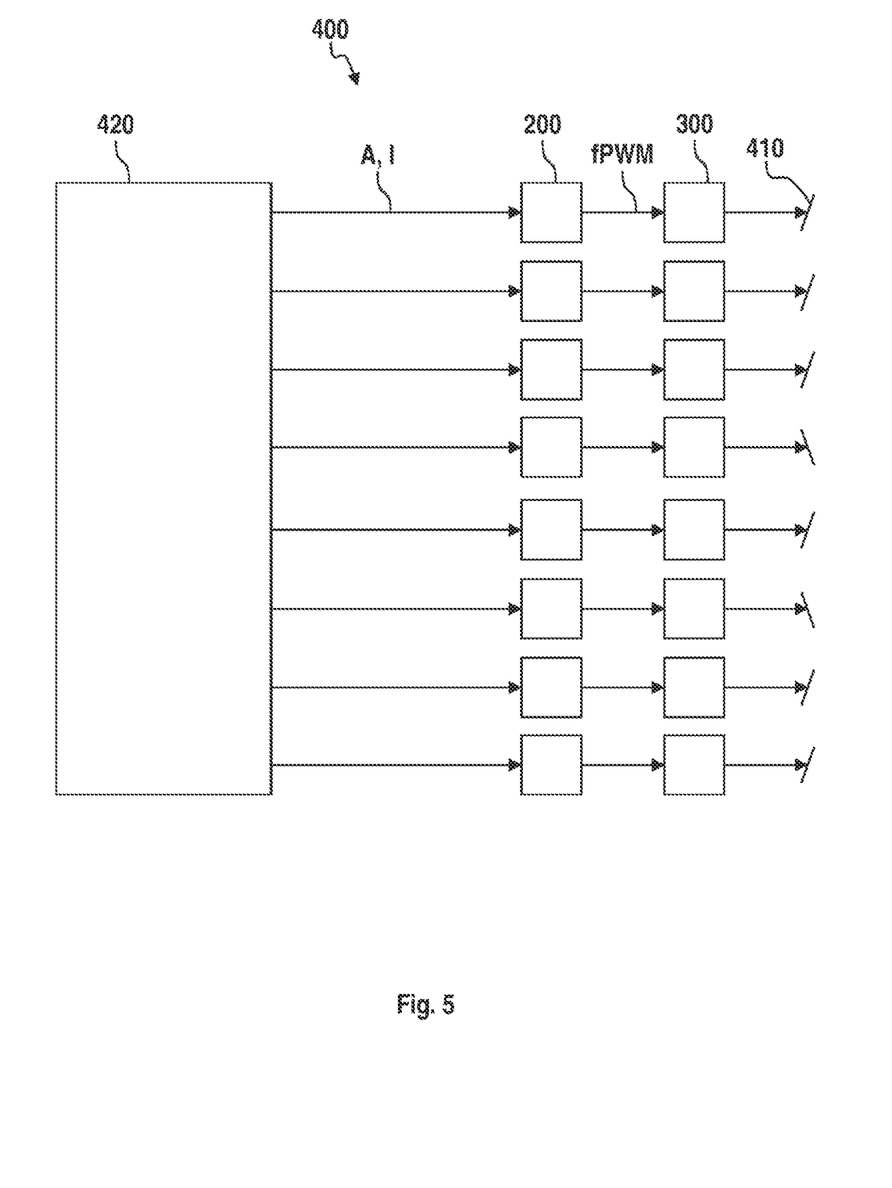
FIG. 5 shows a schematic block diagram of an embodiment of an optical system.

FIG. 5 shows a schematic block diagram of an embodiment of an optical system 400 including a plurality of actuatable optical elements 410. The optical system 400 is designed here as a micromirror array, wherein the optical elements 410 are micromirrors. Each micromirror 410 is actuatable via an assigned actuator 300. By way of example, a respective micromirror 410 can be tilted about two axes and/or displaced in one, two, or three spatial axes via the assigned actuator 300. The reference signs only of the topmost row of these elements are depicted, for reasons of clarity.

The optical system 400 includes a correction unit 420 configured for generating a drive signal A or an input signal I for each of the micromirrors 410. By way of example, the optical system 400 is configured for correcting a wavefront of light in a lithography apparatus 600A, 600B (see FIGS. 6A, 6B), wherein the correction unit 420, for example, depending on a measured shape of the wavefront and a target shape of the wavefront, determines a target position of each of the micromirrors 410 and outputs a corresponding drive signal A or input signal I.

The respective drive signal A or input signal I is fed to a drive device 200 assigned to a respective actuator 300. The drive device 200 drives the respective actuator 300 with a filtered, amplified modulation signal fPWM. The filtered signal fPWM is generated for example as described with reference to FIG. 4. A position of the respective micromirror 410 is thus set.

Since the modulation signal PWM for each actuator 300 is generated using pulse width modulation as described above, the drive devices 200 can be synchronized among one another in such a way that, at a given time, only exactly one modulation signal PWM changes into the next period P, with the respective modulation signal PWM switching from "low" to "high". For example, this unburdens a voltage source Vcc (see FIG. 4), which can operate a plurality of the drive devices 200. Therefore, the voltage source Vcc can have a simpler embodiment.

Figure 6A:
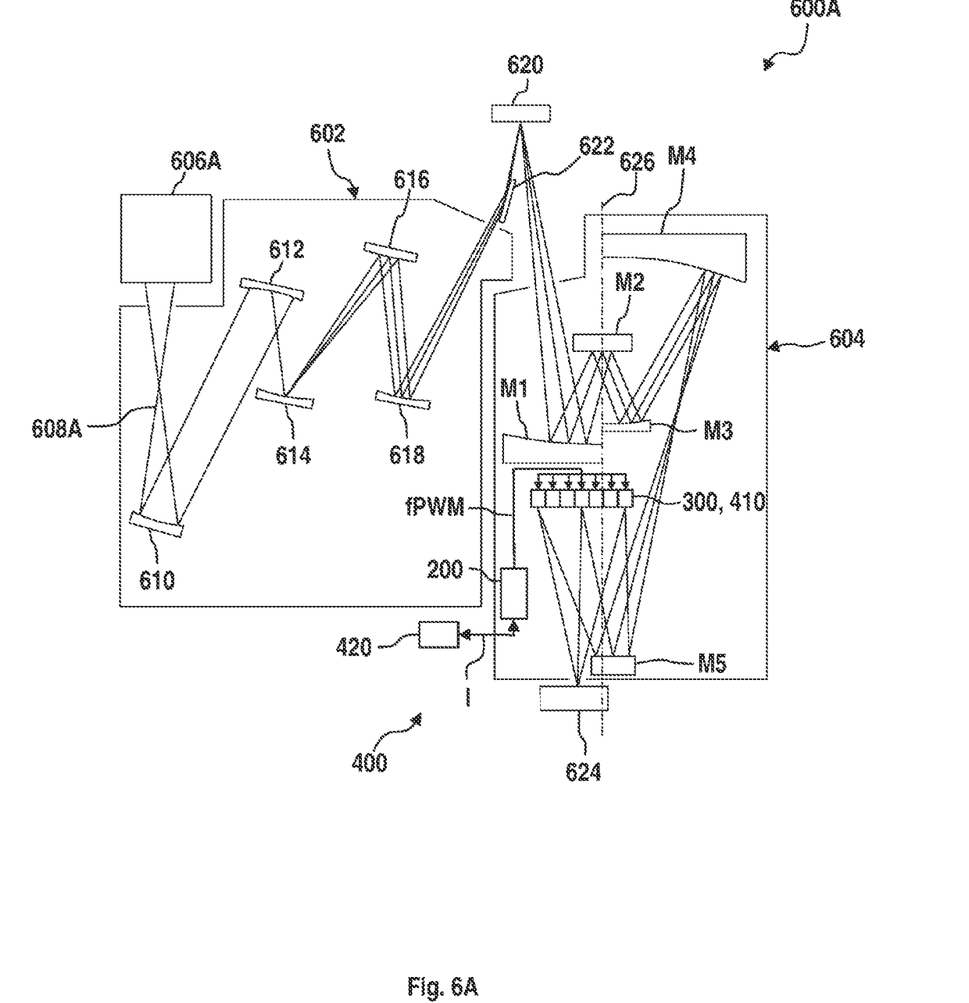
FIG. 6A shows a schematic view of an embodiment of an EUV lithography apparatus.

FIG. 6A shows a schematic view of an EUV lithography apparatus 600A including a beam-shaping and illumination system 602 and a projection system 604. In this case, EUV stands for "extreme ultraviolet" and denotes a wavelength of the working light of between 0.1 nm and 30 nm. The beam-shaping and illumination system 602 and the projection system 604 are respectively provided in a vacuum housing (not shown), wherein each vacuum housing is evacuated with the aid of an evacuation device (not shown). The vacuum housings are surrounded by a machine room (not shown), in which drive devices for mechanically moving or setting optical elements are provided.

Moreover, electrical controllers and the like may also be provided in this machine room.

The EUV lithography apparatus 600A includes an EUV light source 606A. A plasma source (or a synchrotron), which emits radiation 608A in the EUV range (extreme ultraviolet range), that is to say for example in the wavelength range of 5 nm to 20 nm, can for example be provided as the EUV light source 606A. In the beam-shaping and illumination system 602, the EUV radiation 608A is focused and the desired operating wavelength is filtered out from the EUV radiation 608A. The EUV radiation 608A generated by the EUV light source 606A has a relatively low transmissivity through air, for which reason the beam-guiding spaces in the beam-shaping and illumination system 602 and in the projection system 604 are evacuated.

The beam-shaping and illumination system 602 illustrated in FIG. 6A has five mirrors 610, 612, 614, 616, 618. After passing through the beam-shaping and illumination system 602, the EUV radiation 608A is guided onto a photomask (reticle) 620. The photomask 620 is likewise formed as a reflective optical element and may be arranged outside the systems 602, 604. Furthermore, the EUV radiation 608A may be directed onto the photomask 620 via a mirror 622. The photomask 620 has a structure which is imaged onto a wafer 624 or the like in a reduced fashion via the projection system 604.

The projection system 604 (also referred to as a projection lens) has five mirrors M1 to M5 for imaging the photomask 620 onto the wafer 624. In this case, individual mirrors M1 to M5 of the projection system 604 may be arranged symmetrically in relation to an optical axis 526 of the projection system 504. It should be noted that the number of mirrors M1 to M6 of the EUV lithography apparatus 600A is not restricted to the number shown. A greater or lesser number of mirrors M1 to M5 may also be provided.

Furthermore, the mirrors M1 to M5 are generally curved at their front side for beam shaping.

Furthermore, the projection system 604 includes an optical system 400 having a plurality of actuatable optical elements 410, for example the micromirror array described with reference to FIG. 5. The optical system 400 is configured for example for correcting dynamic imaging aberrations. The projection system 604 including the optical system 400 can be referred to as an adaptive optical unit. A resolution of the lithography apparatus 600A can thereby be increased. By way of example, depending on measured values of the wavefront of the projection light, a correction unit 420 generates an input signal I, which can include an individual signal for example for a respective micromirror 410. The input signal I is converted into an amplified, filtered modulation signal fPWM by the drive unit 200 for a respective optical element 410, and output to the respective actuator 300 for actuating the optical element 410. The respective actuator 300 actuates the assigned micromirror 410 accordingly. Reference is made to the fact that the arrangement of the drive unit 200 within the projection system 604 is optional.

Figure 6B:
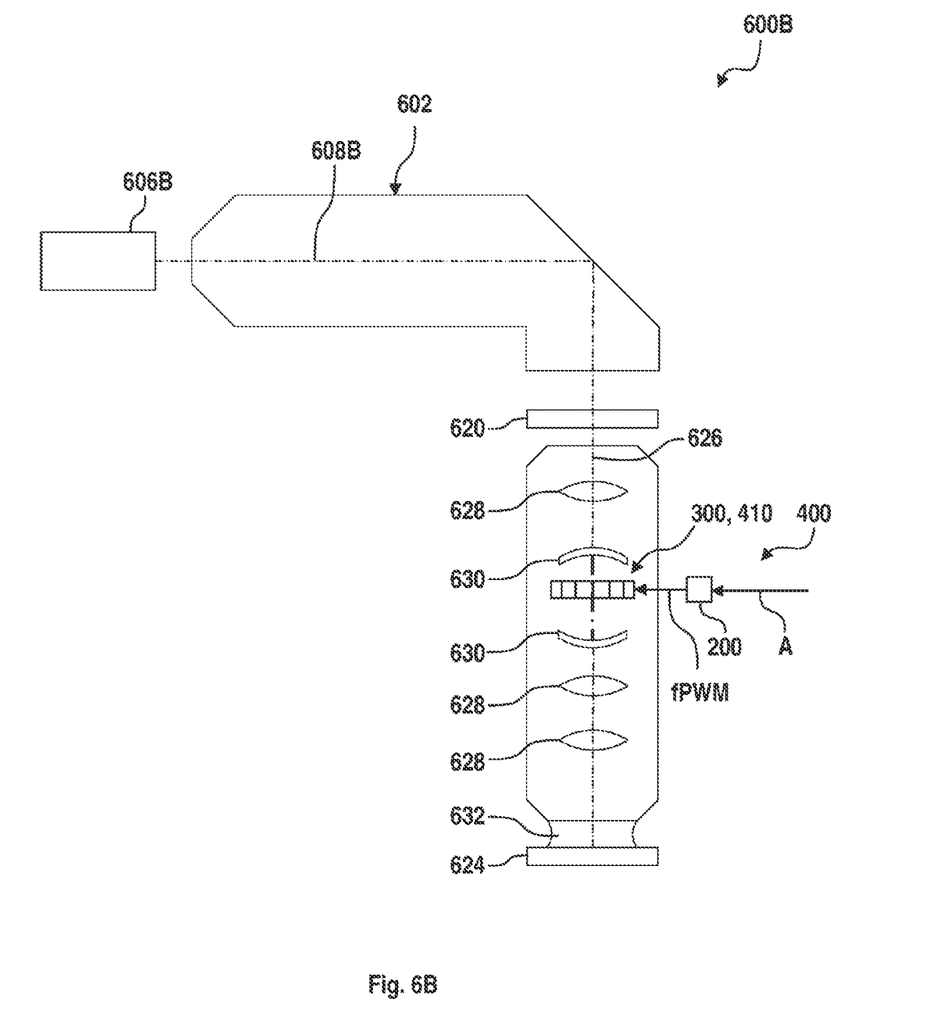
FIG. 6B shows a schematic view of an embodiment of a DUV lithography apparatus.

FIG. 6B shows a schematic view of a DUV lithography apparatus 600B, which includes a beam-shaping and illumination system 602 and a projection system 604. In this case, DUV stands for "deep ultraviolet" and denotes a wavelength of the working light of between 30 nm and 250 nm. As has already been described with reference to FIG. 6A, the beam-shaping and illumination system 602 and the projection system 604 may be arranged in a vacuum housing and/or be surrounded by a machine room with corresponding drive devices.

The DUV lithography apparatus 600B has a DUV light source 606B. By way of example, an ArF excimer laser that emits radiation 608B in the DUV range at 193 nm, for example, can be provided as the DUV light source 606B.

The beam-shaping and illumination system 602 illustrated in FIG. 6B guides the DUV radiation 608B onto a photomask 620. The photomask 620 is formed as a transmissive optical element and may be arranged outside the systems 602, 604. The photomask 620 has a structure which is imaged onto a wafer 624 or the like in a reduced fashion via the projection system 604.

The projection system 604 has multiple lens elements 628 and/or mirrors 630 for imaging the photomask 620 onto the wafer 624. In this case, individual lens elements 628 and/or mirrors 630 of the projection system 604 may be arranged symmetrically in relation to an optical axis 626 of the projection system 604. It should be noted that the number of lens elements 628 and mirrors 630 of the DUV lithography apparatus 600B is not restricted to the number shown. A greater or lesser number of lens elements 628 and/or mirrors 630 can also be provided. Furthermore, the mirrors 630 are generally curved at their front side for beam shaping.

Furthermore, the projection system 604 includes an optical system 400 having a plurality of actuatable optical elements 410, for example a microlens element array, which can be constructed for example according to the micromirror array described with reference to FIG. 5, wherein microlens elements are used instead of the micromirrors. The optical system 400 is configured for example for correcting dynamic imaging aberrations. The projection system 604 including the optical system 400 can be referred to as an adaptive optical unit. A resolution of the lithography apparatus 600B can thereby be increased. In order to improve the imaging performance, in the present case a drive signal A is predefined from outside. The drive signal A includes, for example, an individual signal for each of the microlens elements 410 of the optical system 400. The drive signal A can be generated by an external computing device, for example. The drive unit 200 converts the signal contained in the drive signal A for a respective microlens element 410 into an amplified, filtered modulation signal fPWM and outputs the latter to the respective actuator 300. The respective actuator 300 correspondingly actuates the assigned microlens element 410.

An air gap between the last lens element 628 and the wafer 624 may be replaced by a liquid medium 632 which has a refractive index of >1. The liquid medium 632 may be for example high-purity water. Such a set-up is also referred to as immersion lithography and has an increased photolithographic resolution. The medium 632 can also be referred to as an immersion liquid.

Figure 7:
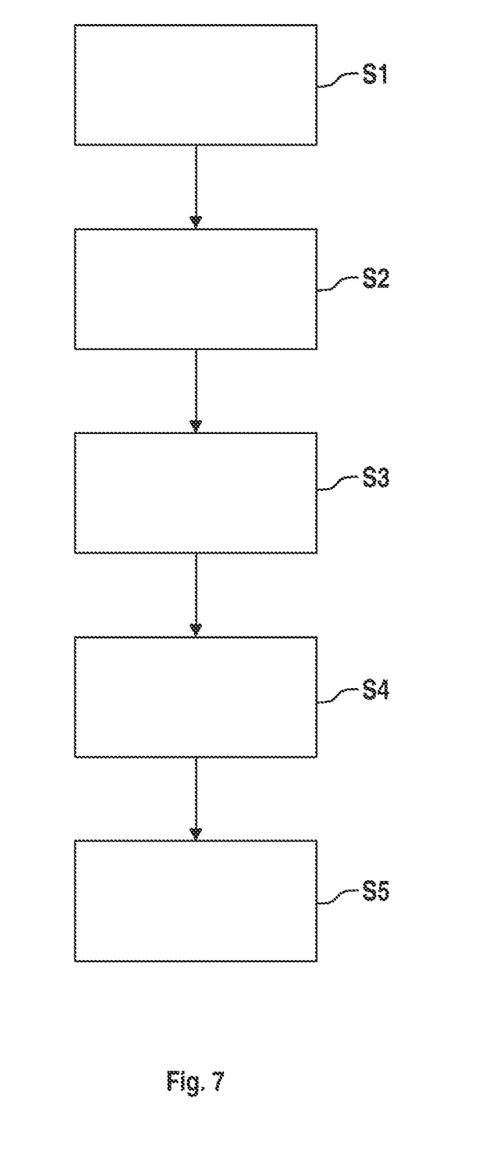
FIG. 7 shows a block diagram of an exemplary embodiment of a method for generating a modulation signal.

FIG. 7 shows a schematic block diagram of an embodiment of a method for generating a 1-bit wide modulation signal PWM from an N-bit wide input signal I.

In a first step S1, an M-bit wide first partial signal Xh including M more significant bits of the input signal I is generated. In a second step S2, an L-bit wide second partial signal Xl including L less significant bits of the input signal I is generated, where L=N−M. In a third step S3, a 1-bit wide pulse density modulation signal PDM is generated on the basis of the second partial signal Xl. In a fourth step S4, an M-bit wide summation signal Xs is generated on the basis of the first partial signal Xh and the pulse density modulation signal PDM. In a fifth step S5, the 1-bit wide modulation signal PWM is generated on the basis of the summation signal Xs.

LIST OF REFERENCE SIGNS

100 Modulation device
110 Signal splitter
120 First modulation unit
122 Summation node
123 Summation node
124 Retardation member
126 Comparator
128 Multiplication member
130 Summation unit
140 Second modulation unit
142 Counter
144 Comparator
200 Drive device
210 First unit
220 Amplifier unit
221 Gate driver
222 Transistor 223 Transistor
224 Diode
230 Filter unit
231 Inductor
232 Resistor
233 Capacitor
300 Actuator
400 Optical system
410 Optical element
420 Correction unit
600A EUV lithography apparatus
600B DUV lithography apparatus
602 Beam-shaping and illumination system
604 Projection system
606A EUV light source
606B DUV light source
608A EUV radiation
608B DUV radiation
610 Mirror
612 Mirror
614 Mirror
616 Mirror
618 Mirror
620 Photomask
622 Mirror
624 Wafer
626 Optical axis
628 Lens
630 Mirror
632 Medium
aPWM Amplified signal
A Drive signal
AV Drive voltage feedback
f1 Internal clock frequency
fPWM Filtered signal
GND Ground potential
HV High-voltage feedback
I Input signal
M1 Mirror
M2 Mirror
M3 Mirror
M4 Mirror
M5 Mirror
P Period
P* Period
PDM Pulse density modulation signal
PWM Modulation signal
PWM1 Pulse width modulation signal
PWM2 Pulse width modulation signal
S1 Method step
S2 Method step
S3 Method step
S4 Method step
S5 Method step
Vcc Voltage source
Xh First partial signal
Xl Second partial signal
Xs Summation signal

What is claimed is:

1. A drive device, comprising:
a modulation device configured to generate a 1-bit wide pulse width modulation signal on the basis of an N-bit wide input signal;
an amplifier unit configured to generate an amplified signal on the basis of the 1-bit wide modulation signal;
a filter unit configured to filter the amplified signal and to output the filtered signal to drive an actuator; and
a first unit configured to generate the N-bit wide input signal on the basis of a drive signal, wherein the first unit is configured to generate the input signal on the basis of at least one member selected from a group consisting of: i) a high-voltage feedback of a voltage supply of the amplifier unit; and ii) a drive voltage feedback of the filtered signal.

2. The drive device of claim 1, wherein the modulation device comprises:
a signal splitter configured to generate: i) an M-bit wide partial signal comprising M more significant bits of the N-bit wide input signal; and ii) an L-bit wide partial signal comprising L less significant bits of the N-bit wide input signal, where L=N—M;
a first modulation unit configured to generate a 1-bit wide pulse density modulation signal on the basis of the L-bit wide partial signal;
a summation unit configured to generate an M-bit wide summation signal on the basis of the M-bit wide partial signal and the 1-bit wide pulse density modulation signal; and
a second modulation unit configured to generate the 1-bit wide pulse width modulation signal on the basis of the M-bit wide summation signal.

3. The drive device of claim 2, further comprising a clock generator configured to generate an internal clock frequency f1, wherein the second modulation unit is configured to generate the 1-bit wide pulse width modulation signal with a period of $2^m/f1$.

4. The drive device of claim 2, wherein the signal splitter is configured to generate the M-bit wide partial signal and the L-bit wide partial signal on the basis of $L/M \leq 1$.

5. The drive device of claim 2, wherein the signal splitter is configured to generate the M-bit wide partial signal and the L-bit wide partial signal on the basis of $L/M \leq 0.5$.

6. The drive device of claim 1, wherein the input signal has a width N of from four bits to 64 bits.

7. The drive device of claim 6, further comprising a clock generator configured to generate an internal clock frequency f1, wherein the second modulation unit is configured to generate the 1-bit wide pulse width modulation signal with a period of $2^m/f1$.

8. The drive device of claim 6, wherein the signal splitter is configured to generate the first and second partial signals on the basis of $L/M \leq 1$.

9. The drive device of claim 1, further comprising a first unit configured to generate the N-bit wide input signal on the basis of a drive signal.

10. The drive device of claim 9, wherein the first unit is configured to generate the N-bit wide input signal on the basis of at least one member selected from the group consisting of a high-voltage feedback of a voltage supply of the amplifier unit, and a drive voltage feedback of the filtered signal.

11. The drive device of claim 9, wherein a clock frequency of the first unit is greater than or equal to a clock frequency of the 1-bit wide pulse width modulation signal.

12. The drive device of claim 1, wherein the amplifier unit comprises a switching amplifier.

13. The drive device of claim 1, wherein the filter unit comprises at least one member selected from the group consisting of an inductor, a resistor, and a capacitor.

14. An optical system, comprising:
an actuatable optical element; and
an actuator; and
a drive device according to claim 1.

15. The optical system of claim 14, further comprising a plurality of actuatable optical elements, wherein respective switching times of amplifier units of at least two drive devices differ from each other.

16. The optical system of claim 14, wherein the actuator comprises at least one member selected from the group consisting of a capacitive load and an inductive load.

17. An apparatus, comprising:
an optical system, comprising:
an actuatable optical element; and
an actuator; and
a drive device according to claim 1.

18. A method, comprising:
generating an N-bit wide input signal on the basis of:
a drive signal; and at least one member selected from a group consisting of: 1) a high-voltage feedback of a voltage supply of an amplifier unit and ii) a drive voltage feedback of a filtered signal
generating a 1-bit wide pulse width modulation signal on the basis of the N-bit wide input signal;
generating amplified and filtered signals on the basis of the 1-bit wide pulse width modulation signal; and
driving actuatable optical elements of an optical system on the basis of the amplified and filtered modulation signals.

19. The method of claim 18, further comprising:
generating an M-bit wide partial signal comprising M more significant bits of the N-bit wide input signal;
generating an L-bit wide partial signal comprising L less significant bits of the N-bit wide input signal, where L=N—M;
generating an 1-bit wide pulse density modulation signal on the basis of the second L-bit wide partial signal;
generating an M-bit wide summation signal on the basis of the M-bit wide partial signal and the 1-bit wide pulse density modulation signal; and
generating the 1-bit wide pulse width modulation signal on the basis of the M-bit wide summation signal.

20. One or more machine-readable hardware storage devices comprising instructions that are executable by one or more processing devices to perform the method of claim 18.

21. A system comprising:
one or more processing devices; and
one or more machine-readable hardware storage devices comprising instructions that are executable by the one or more processing devices to perform operations comprising the method of claim 18.

* * * * *

UNITED STATES PATENT AND TRADEMARK OFFICE
CERTIFICATE OF CORRECTION

PATENT NO. : 11,901,948 B2
APPLICATION NO. : 17/583396
DATED : February 13, 2024
INVENTOR(S) : Cornelius Richt and Mohammad Awad It is certified that error appears in the above-identified patent and that said Letters Patent is hereby corrected as shown below:

In the Specification

Column 4, Line 40, delete "$P^*=P/2^N\text{-}M$" insert -- $P^*=P/2^{N-M}$ --.

In the Claims

Column 18, Line 43, Claim 7, delete "$2^m/f1$." insert -- $2^M/f1$. --.

Column 19, Line 16, Claim 18, delete "1)" insert -- i) --.

Signed and Sealed this
Ninth Day of April, 2024

Katherine Kelly Vidal
*Director of the United States Patent and Trademark Office*